United States Patent [19]

Ravipati

[11] Patent Number: 5,708,358
[45] Date of Patent: Jan. 13, 1998

[54] SPIN VALVE MAGNETORESISTIVE TRANSDUCERS HAVING PERMANENT MAGNETS

[75] Inventor: Durga P. Ravipati, Saratoga, Calif.

[73] Assignee: Read-Rite Corporation, Milpitas, Calif.

[21] Appl. No.: 619,369

[22] Filed: Mar. 21, 1996

[51] Int. Cl.[6] .................................................. G01R 33/02
[52] U.S. Cl. ...................... 324/252; 338/32 R; 360/113;
428/668; 428/694 R; 428/694 TM; 428/694 T;
428/694 TS
[58] Field of Search .................. 428/694 R, 694 TM,
428/694 T, 694 TS, 678, 679, 668; 360/113;
324/252; 338/32 R

[56] References Cited

U.S. PATENT DOCUMENTS

| 5,159,513 | 10/1992 | Dieny et al. | 360/113 |
|---|---|---|---|
| 5,329,413 | 7/1994 | Kondoh et al. | 360/113 |
| 5,343,422 | 8/1994 | Kung et al. | 365/173 |
| 5,438,470 | 8/1995 | Ravipati et al. | 360/113 |
| 5,485,334 | 1/1996 | Nix et al. | 360/113 |
| 5,495,378 | 2/1996 | Bonyhard et al. | 360/113 |
| 5,550,683 | 8/1996 | Koren | 360/46 |

FOREIGN PATENT DOCUMENTS

| 0375646-A2 | 6/1990 | European Pat. Off. . |
| 0422806-A2 | 4/1991 | European Pat. Off. . |

OTHER PUBLICATIONS

Hunt, R. P., and A. A. Jaeklin, Composite Films as a Domain-Wall Barrier, J. Applied Physics, vol. 37, No. 3, 1272-1273, Mar. 1, 1966.

*Primary Examiner*—Paul J. Thibodeau
*Assistant Examiner*—Holly C. Rickman
*Attorney, Agent, or Firm*—Nathan N. Kallman

[57] ABSTRACT

A spin valve magnetoresistive sensor includes a substrate and a layered structure formed on the substrate. The layered structure includes a pair of thin film layers of ferromagnetic material separated from each other by a nonmagnetic spacer. The direction of magnetization of one of the thin film layers is pinned by a first permanent magnet layer. A second permanent magnet layer is located adjacent to the other of the thin film layers for longitudinal biasing purposes. The first permanent magnet layer has significantly higher coercivity than the second permanent magnet layer.

4 Claims, 5 Drawing Sheets

SPIN VALVE MAGNETORESISTIVE TRANSDUCERS HAVING PERMANENT MAGNETS

FIELD OF THE INVENTION

This invention relates to magnetic transducers used for reading recorded signals from a magnetic medium and in particular to an improved magnetoresistive (MR) read transducer.

DESCRIPTION OF THE PRIOR ART

MR sensors are capable of reading recorded signals from a magnetic surface at high linear densities. An MR sensor detects magnetic field signals by the resistance changes of a magnetic read element as a function of the amount and direction of magnetic flux being sensed by the element. One type of prior art MR sensor operates on the basis of the anisotropic magnetoresistive (AMR) effect in which a component of the resistance varies as the square of the cosine of the angle between the magnetization and the direction of current flow. These MR sensors operate on the basis of the AMR effect even though this effect produces only a relatively small percentage change in the resistance.

Another MR type of sensor has been identified in which the resistance between two uncoupled ferromagnetic layers varies as the cosine of the angle between the magnetizations of the two layers and is independent of the direction of current flow. This mechanism produces a magnetoresistance that, for selected combinations of materials, is greater in magnitude than that for the AMR effect, and is referred to as "spin valve" (SV) magnetoresistance.

A publication entitled *Design, Fabrication and Testing of Spin-Valve Read Heads for High Density Recording*, IEEE Transaction On Magnetics, November 1994, pages 3801–3806, Tsang et al, describes an SV structure in which a first ferromagnetic layer is fixed or "pinned" in its magnetic orientation direction and a second ferromagnetic layer separated from the first layer has its magnetic movement free to rotate in response to signal fields to be sensed.

As shown in FIG. 1, U.S. Pat. No. 5,159,513, Dieny et al, an SV MR sensor comprises a layered structure formed on a substrate. The MR sensor comprises a substrate 24 such as glass, ceramic or a semiconductor upon which is deposited a first thin film layer 23 of soft ferromagnetic material, a thin film layer 25 of nonmagnetic metallic material and a second thin film layer 26 of ferromagnetic material. The two layers 23, 26 of ferromagnetic material are oriented with their magnetizations at an angle of about 90 degrees to each other in the absence of an applied magnetic field. The magnetization of the second layer 26 of ferromagnetic material is fixed in position as shown by the arrow 27. The magnetization in the first layer 23 of ferromagnetic material in the absence of an applied magnetic field is represented by the dashed arrow 28. Changes in magnetization in layer 23 are indicated by rotation of arrow 28 in response to changes of an applied magnetic field such as magnetic field h.

The second layer 26 of ferromagnetic material is of a higher coercivity than that of the first layer 23 of ferromagnetic material so that the magnetization of layer 26 can be fixed in position. A thin film layer 29 of an antiferromagnetic material of high resistance is deposited in direct contact with second thin film layer 26 so that a biasing field is produced by exchange coupling.

When operating in a disk drive, for example, and located adjacent to a magnetic disk with recorded date signals, a current flow is produced through the MR sensor. The variations in voltage across the sensor, caused by changes in the resistance of the MR element produced by rotation of the magnetization in the first layer 23 of ferromagnetic material as a function of the magnetic field being detected, are sensed.

SUMMARY OF THE INVENTION

In accordance with the invention, an MR sensor comprising a layered structure formed on a substrate includes first and second thin film layers of ferromagnetic material, preferably made of NiFe, separated by a thin film layer of nonmagnetic metallic material. When a current flow is produced through the MR sensor, variations are sensed in the resistivity of the MR sensor due to the difference in rotation of the magnetizations in the layers of ferromagnetic material as a function of the magnetic field being detected.

The present invention employs a first permanent magnet (PM) layer to pin the first MR layer (the pinned layer) and uses another PM layer adjacent to the second MR layer (the free layer) to provide biasing. The first MR layer is deposited on a high coercivity layer to form the pinned MR layer. The second MR layer, separated from the first layer by nonmagnetic material, is deposited on this structure.

In the fabrication of structures in accordance with this invention, a permanent magnet (PM) layer of material, such as CoCrPt is used in the MR structure. The first MR layer is deposited on top of the PM layer and is pinned in a given magnetic direction. Thin layers of Co, Cu and Co are deposited in sequence, and the second MR layer is then deposited. A second PM layer is deposited to interact magnetostatically with the second MR layer to provide longitudinal biasing. The magnetic orientation of the second MR layer is perpendicular to the orientation of the first MR layer. The second PM layer has a lower coercivity than the first PM layer so that the second PM layer does not pin the second MR layer as occurs with the first PM layer and the first MR layer.

BRIEF DESCRIPTION OF THE DRAWINGS

With reference to FIGS. 2 and 3, a substrate 1 is made of a material, such as alumina-titanium carbide, on which the device is built. A dielectric layer 2, made from $Al_2O_3$ or $SiO_2$, isolates the MR device from substrate 1. Typical thicknesses for dielectric layer 2 are in the range of 4–20 μm. A shield layer 3, made of NiFe or other high permeability material, is deposited next to a thickness range of about 1.5–3.0 μm. The purpose of shield layer 3 is to slim an isolated pulse because the MR element cannot "see" a magnetic transition until the transition is within the gap between the shields of an MR sensor head.

Figure 1:
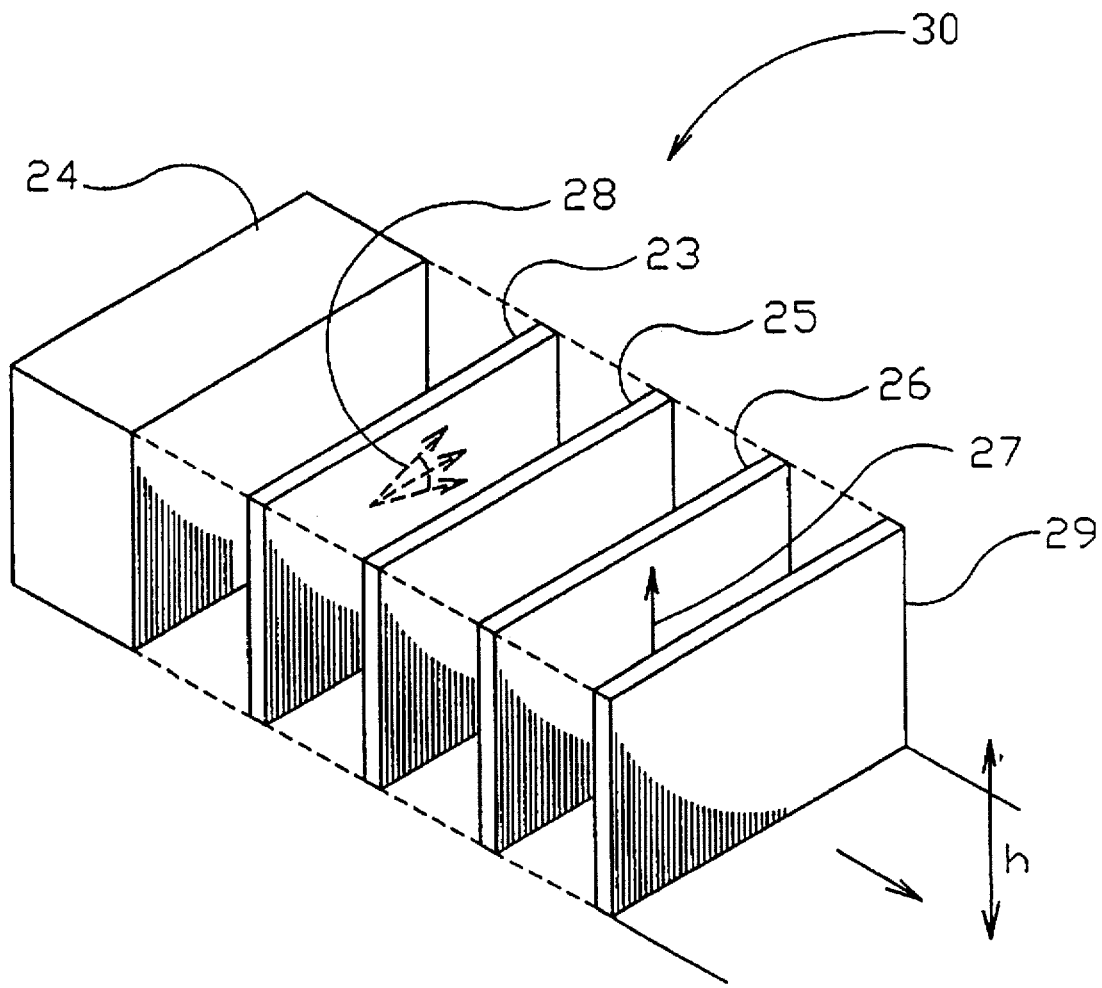
FIG. 1 is an exploded isometric view of the prior art Dieny et al patented structure.

A dielectric gap 2A (the first gap), preferably 500–2500 Å thick, made of a dielectric material such as alumina, isolates the MR element electrically and magnetically. An underlayer 4, made from Cr for example, provides the preferred (100) orientation for a subsequent layer 5 of high coercivity hard permanent magnet (PM) material. The Cr layer 4 thickness is preferably in the range of 100–500 Å. Hard PM layer 5 of high coercivity material, such as CoCrPt, CoCrTa, CoCrPtTa, CoCrPtB or the like, about 100–800 Å thick is deposited over the Cr layer 4. The PM layer 5 is also referred to as the pinning layer.

A pinned layer, made of NiFe for example, is the first of the two MR layers of the sensor. The layer 6 is magnetically pinned by high coercivity layer 5 and is locked into one magnetic position. The thickness of MR layer 6 is in the range of 10–200 Å. A thin layer 7 of Co functions as an enhancing layer that improves the ΔR/R ratio (where R is resistance), and is about 5–50 Å thick.

A conductive spacer layer 8, made of Cu for example, having thickness of about 5–35 Å is deposited on Co layer 7. A thin layer 9 of Co provides the same function as Co layer 7 with the same thickness range. The free MR layer 10, made of NiFe or FeCo, by way of example, is deposited to a thickness range between 20–200 Å. A Cr underlayer 11 is then deposited having the same function as Cr underlayer 4. Longitudinal bias is applied to the free MR layer 10. The bias field is perpendicular to the magnetic field of the pinned MR layer 5. A hard PM layer 12 is then deposited and serves the same function as PM layer 5, and has the same thickness range.

The first MR layer 6 is magnetically coupled with the hard PM layer 5 of high coercivity. The second MR layer 10 is magnetostatically coupled and interacts with the PM layer 12 to provide transverse biasing. The coercivity of the first PM layer 5 is about twice that of the second PM layer 12, which provides longitudinal bias to the MR layer 10. The use of hard permanent magnetic material for the pinning layers solves the problem of corrosion that exists with materials, such as FeMn, CoNiO, and NiMn which are used in prior art MR sensors.

A conductive lead layer 13, which is made of Au, W or AuCu, provides a current path for the MR device. A second gap 14 of dielectric material having the same function as upper layer 2A is provided. A second shield layer 15 that serves the same function as shield layer 3, and having the same thickness range and material, is then deposited.

Figure 2:
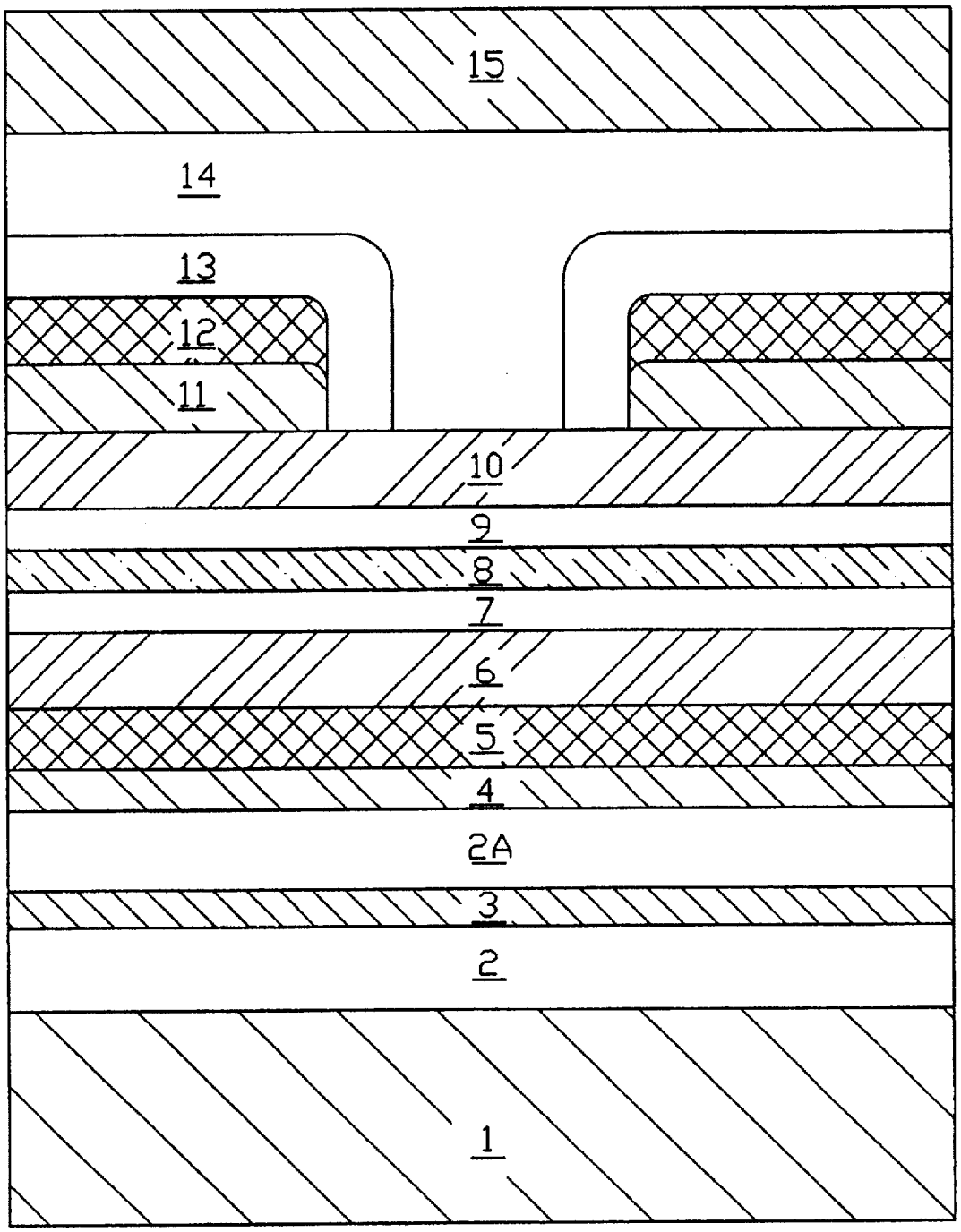
FIG. 2 is a cross-sectional view of one embodiment of an MR sensor according to the present invention.
Figure 3:
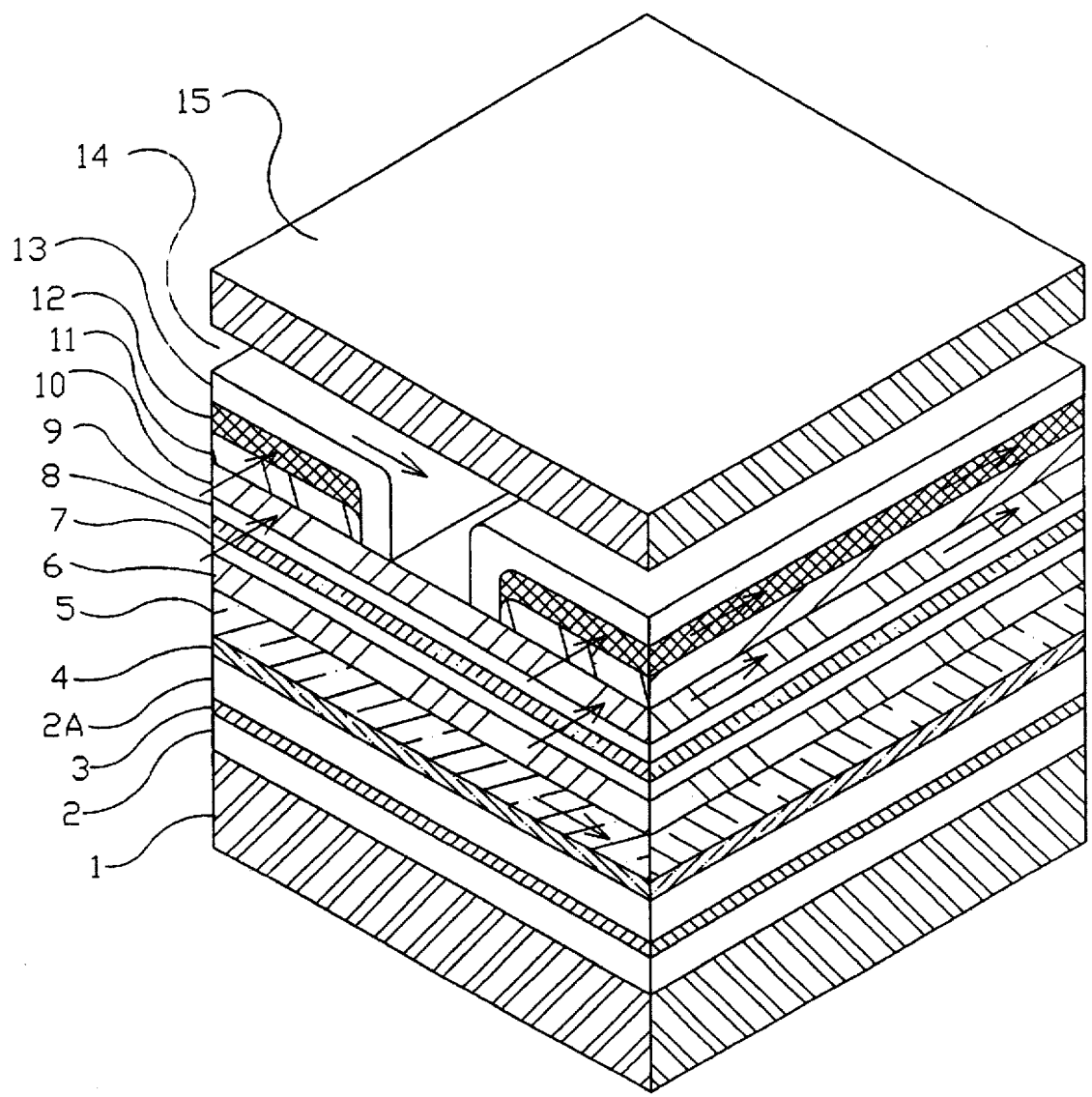
FIG. 3 is an isometric view of the embodiment of FIG. 2.
Figure 4:
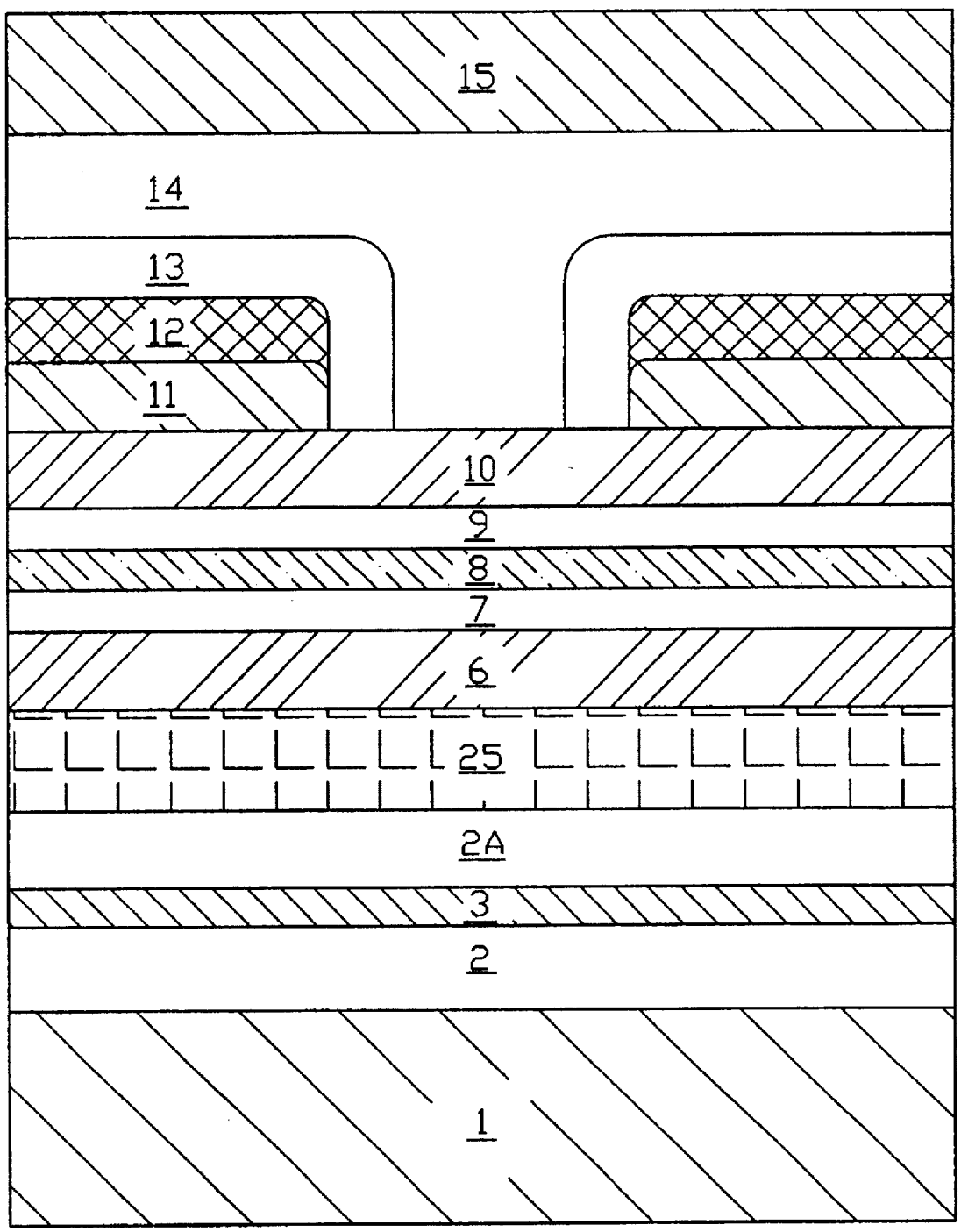
FIG. 4 is a cross-sectional view of an alternate embodiment of an MR sensor according to the present invention.
Figure 5:
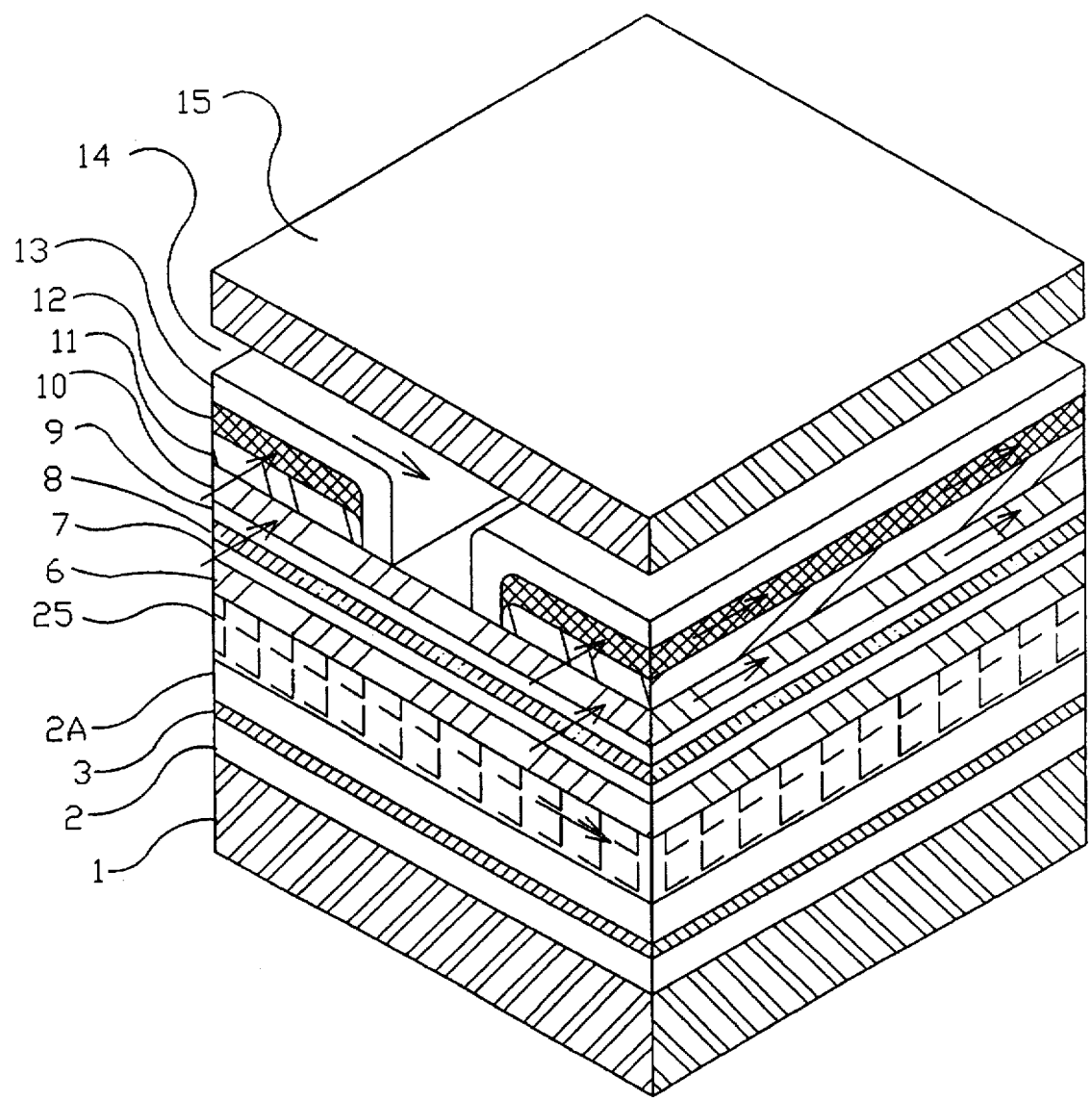
FIG. 5 is an isometric view of the embodiment of FIG. 4.

With reference to the alternate embodiment of FIGS. 4 and 5, reference numerals 1–3 including 2A, 6–15 identify layers having functions, compositions and thickness ranges comparable to those similarly identified layers shown and described above in connection with the embodiment of FIGS. 2 and 3. In FIGS. 4 and 5, layer 25 is a high coercivity pinning layer, made from FeMn, NiCoO, NiO, for example, which magnetically pins MR layer 6 into one magnetic position.

By virtue of this invention, an MR read transducer structure is made by a simplified process using conventional masking, photolithographic and deposition steps. Corrosion of the permanent magnetic material is minimized.

What is claimed is:

1. A magnetoresistive sensor comprising:

a substrate;

a dielectric layer disposed on said substrate;

a first shield layer of high permeability for slimming isolated pulses sensed by the magnetoresistive sensor;

a first dielectric gap layer deposited on said dielectric layer;

a high coercivity first permanent magnetic layer formed above said dielectric gap layer;

a first underlayer disposed between said dielectric gap layer and said first permanent magnet layer for providing an orientation to said first permanent magnet layer;

a first magnetoresistive layer deposited over said first permanent magnet layer, said first magnetoresistive layer being pinned by said first permanent magnet layer;

a first enhancing layer of cobalt formed on said first magnetoresistive layer for improving the ΔR/R of said magnetoresistive sensor;

a conductive spacer disposed on said first enhancing layer;

a second enhancing layer of cobalt formed on said conductive spacer;

a second magnetoresistive layer deposited over said second enhancing layer;

a second underlayer having spaced segments disposed over said second magnetoresistive layer, said segments of said second underlayer having inner and outer ends;

a second permanent magnet layer having spaced portions formed over said spaced segments of said second underlayer, said spaced portions of said second permanent magnet layer having inner and outer ends in alignment with said ends of said segments of said second underlayer, said second permanent magnet means having a lower coercivity than that of said first permanent magnet layer and providing longitudinal bias to said second magnetoresistive layer;

spaced conductive leads deposited over said portions of said second permanent magnet layer and adjacent to said inner ends of said second underlayer segments and said inner ends of said spaced portions of said second permanent magnet;

a second dielectric gap formed over and adjacent to said conductive leads; and a second shield layer deposited over said second dielectric gap;

wherein changes in the resistivity of the sensor are produced as a result of rotation of the direction of magnetization in said second magnetoresistive layer.

2. The magnetoresistive sensor of claim 1, wherein said first permanent magnet layer has a coercivity about twice that of said second permanent magnet layer.

3. The magnetoresistive sensor of claim 1, wherein said first permanent magnet layer comprises a layer of permanent magnet material in direct contact with said first magnetoresistive layer.

4. The magnetoresistive sensor of claim 1, further comprising first and second underlayers below said first and second permanent magnetic layer respectively for providing a magnetic orientation to said first and second permanent magnet layers.

* * * * *